United States Patent [19]

DiLorenzo

[11] 3,762,945

[45] Oct. 2, 1973

[54] TECHNIQUE FOR THE FABRICATION OF A MILLIMETER WAVE BEAM LEAD SCHOTTKY BARRIER DEVICE

[75] Inventor: James Vincent DiLorenzo, Piscataway, N.J.

[73] Assignee: Bell Telephone Laboratories, Incorporated, Murray Hill, N.J.

[22] Filed: May 1, 1972

[21] Appl. No.: 249,311

[52] U.S. Cl. ............ 117/215, 117/106 A, 148/175, 156/17, 317/235 UA, 317/235 AM

[51] Int. Cl. ............ B44d 1/02

[58] Field of Search ............ 317/235 UA, 235 AM; 148/175, 1.5; 117/215, 106 A; 156/17

[56] References Cited

UNITED STATES PATENTS

| | | | |
|---|---|---|---|
| 3,208,888 | 9/1965 | Ziegler et al. | 148/175 |
| 3,523,838 | 8/1970 | Heidenreich | 148/175 |
| 3,612,958 | 10/1971 | Saito et al. | 148/175 X |
| 3,675,316 | 7/1972 | Axelrod | 317/235 X |

*Primary Examiner*—Edward G. Whitby
*Attorney*—W. L. Keefauver et al.

[57] ABSTRACT

A technique is described for the fabrication of a novel planar millimeter wave beam lead Schottky barrier device. The inventive technique involves the growth of a 6 to 7 micron layer of epitaxial gallium arsenide doped to 3 to 5 × $10^{18}$ atoms/cc on a semi-insulating gallium arsenide substrate by the arsenic trichloride-gallium-hydrogen vapor transport technique. Following, the epitaxial layer is etched in the same ambient by adding helium and establishing a doping level of 5 × $10^{15}$ to 2 × $10^{17}$ atoms/cc. Growth of a 0.1 to 0.2 micron thick layer of gallium arsenide is then effected. The technique results in the formation of an abrupt doping profile and in a device manifesting enhanced frequency.

2 Claims, 5 Drawing Figures

TECHNIQUE FOR THE FABRICATION OF A MILLIMETER WAVE BEAM LEAD SCHOTTKY BARRIER DEVICE

This invention relates to a technique for the fabrication of a Schottky barrier diode and to the device so produced. More particularly, the present invention relates to a technique for the fabrication of a Schottky barrier diode including a double epitaxial layer of gallium arsenide upon a gallium arsenide substrate.

In recent years, there has been a birth of interest in a class of structures commonly termed integrated microwave circuits. These structures typically include components which are capable of performing mixing, harmonic generation and signal generating functions. Among the most popular materials found suitable for such application is gallium arsenide. This material manifests resistivities greater than $10^6$ ohm centimeters, so suggesting its use as a substrate material which is capable of providing electrical isolation between components. Additionally, gallium arsenide is able to minimize transmission losses in an integrated circuit and is well qualified for use in Schottky barrier diodes serving varactor and mixer functions.

Heretofore, device structures for monolithic integrated circuits have been fabricated by selective growth techniques wherein the desired deposit is patterned by etching into a masking material by photolithographic techniques. Holes are then etched into the gallium arsenide using the masking film to protect the remaining surface of the slice and finally epitaxial deposition is effected. An alternative procedure for attaining this end involves the well-known mesa etching process wherein an epitaxial layer of the order of 1 micron is prepared and the desired device geometry defined by conventional photolithographic techniques.

The Schottky barrier diode is perhaps the most popular of these devices, the easiest to prepare and manifests a minimum of parasitics, so resulting in superior microwave performance. Although such devices have proven satisfactory in numerous applications, their suitability for higher frequency applications has been limited, such being attributed to the inability to obtain selective deposits of gallium arsenide thinner than 0.5 micron.

In accordance with the present invention, the prior art limitations have been effectively obviated by a novel fabrication technique which is capable of yielding epitaxial layers of gallium arsenide of the order of 0.1 micron in thickness. Additionally, the described technique permits the growth of a structure evidencing a more abrupt profile, i.e., a shorter transition region, between differently doped regions of gallium arsenide than was attainable heretofore. Briefly, this inventive technique involves the growth of a 6 to 8 micron layer of epitaxial gallium arsenide doped to a value within the range of $3 \times 10^{18}$ atoms/cc to $5 \times 10^{18}$ atoms/cc on a semi-insulating gallium arsenide substrate by the arsenic trichloride-gallium-hydrogen vapor transport technique. The resultant epitaxial layer is next etched in the same ambient by adding helium thereto and simultaneously reducing the carrier concentration. Finally, a 0.1 to 0.2 micron thick layer of gallium arsenide is then grown by removing helium from the reactive ambient.

The invention will be more fully understood by reference to the following detailed description taken in conjunction with the drawing wherein.

Figure 1:
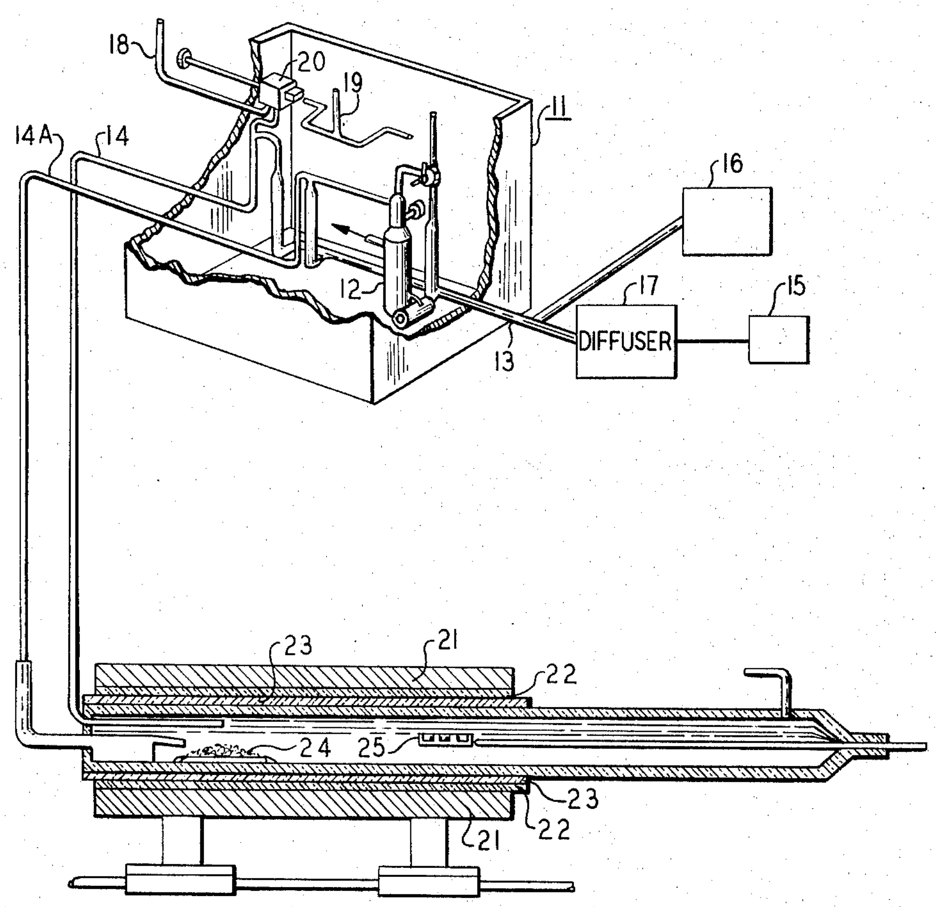
FIG. 1 is a schematic view of a typical apparatus suitable for use in the practice of the present invention.

With reference now more particularly to FIG. 1, there is shown a schematic representation of the apparatus used in the practice of the invention. Shown in the FIG. is a bubbler 11 including a reservoir of arsenic trichloride 12 and conduit means 13, 14, and 14A, respectively, for admitting and removing hydrogen and helium to and from the bubbler system. The system also includes a source of hydrogen 15, a source of helium 16, hydrogen purifier 17, means 18 for admitting a dopant to the system, means 19 for admitting nitrogen to the system and variable leak valve 20. The apparatus employed also includes an oven 21 having contained therein a muffle tube 22 and quartz reaction tube 23.

In the operation of the growth process, heating of the reaction chamber is initiated, hydrogen from source 15 being diffused through palladium-silver membranes in purifier 17 and flowed through control valves to arsenic trichloride reservoir 12. Hydrogen serves as a carrier gas and transports the arsenic trichloride to reaction chamber 23. Additionally, the hydrogen flow serves as a dilute control for the arsenic trichloride flow and for dopant transfer. Reservoir 12 is maintained at a temperature within the range of 15° to 25°C during growth and the flow rate of hydrogen within the range of 300 to 400 cc/min.

Figure 2:
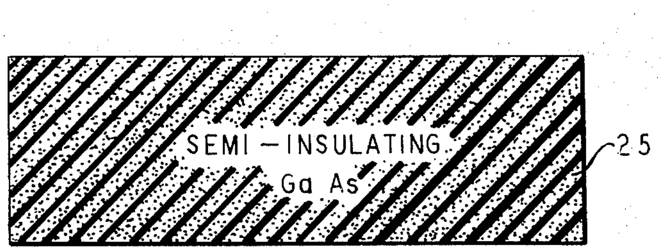
FIG. 2 is a front elevational view in cross section of a gallium arsenide substrate member suitable for use in the inventive technique.

Before initiating the vapor transport process, a source of gallium 24 is introduced into chamber 23 which also includes a suitable substrate member 25 which is shown in cross sectional view in FIG. 2.

The substrate selected for use herein is semi-insulating gallium arsenide manifesting a maximum resistivity of $10^9$ ohm-centimeters. Such materials are commonly obtained by either oxygen or chromium doping techniques well known to those skilled in the art. It is particularly advantageous for integrated microwave circuitry to utilize high resisitivity materials for the purpose of minimizing transmission losses and providing the requisite electrical isolation between devices in a circuit.

Figure 3:
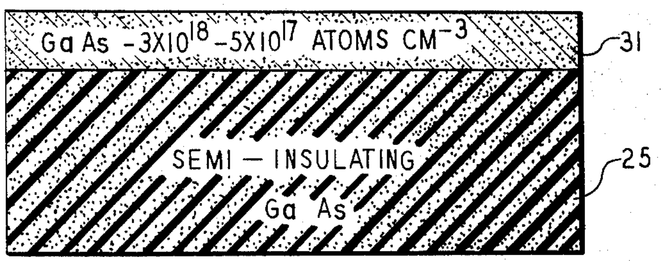
FIG. 3 is a front elevational view in cross section of the structure of FIG. 2 after the deposition thereon of an epitaxial film of highly doped gallium arsenide.

Turning again to the operation of the process, heating of the reaction chamber is continued until the gallium attains a temperature of 750°C and the substrate a temperature of 800°C at which point epitaxial growth is initiated at a rate within the range of 0.2 to 0.3 $\mu$m/min. Growth of an epitaxial layer of gallium arsenide 31 (FIG. 3) ranging in thickness from 6 to 8 microns is continued, the carrier concentration being maintained at a value within the range of $3 \times 10^{18}$ atoms/cc to $5 \times 10^{18}$ atoms/cc by the addition to the reaction system of a suitable dopant, typically sulphur, selenium and the like. The thickness and carrier concentration of epitaxial layer 31 are dictated by considerations relating to the desired resistivity of the deposited layer.

Figure 4:
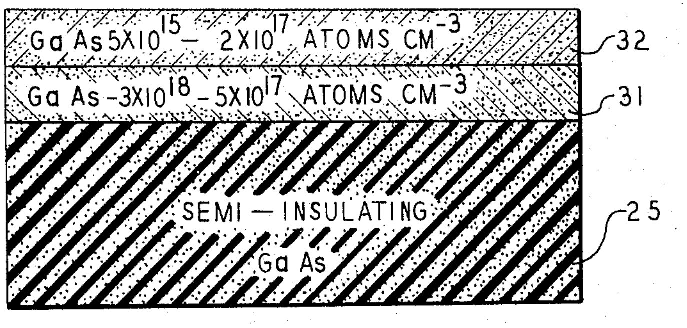
FIG. 4 is a front elevational view in cross section of the structure of FIG. 3 after the deposition thereon of a second epitaxial layer.
Figure 5:
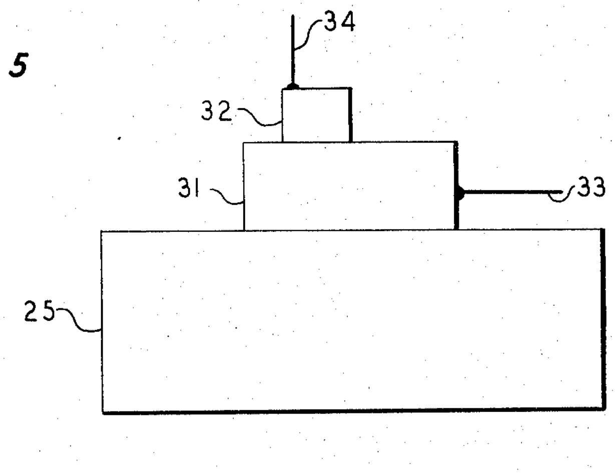
FIG. 5 is a front elevational view in cross section of the structure of FIG. 4 after the attachment thereto of electrical contacts.

The next step in the practice of the invention involves etching epitaxial film 31 while concurrently effecting dopant equilibration, i.e., establishing a doping level within the range of $5 \times 10^{15}$ atoms/cc to $2 \times 10^{17}$ atoms/cc. This end is conveniently attained in the reaction ambient by adding pure grade helium (99.9999 per cent purity) to the hydrogen carrier gas and regulating the flow rates so that the flow of helium ranges from 350 to 450 cc/min. and the hydrogen flow rate ranges from 50 to 20 cc/min., so resulting in etching of layer 31 at a rate within the range of 0.2 to 0.5 $\mu$m/min., the higher rate corresponding with the lower rate of hydrogen flow and the converse. Etching is continued until 3 to 3½ microns is etched from epitaxial layer 31. At that juncture, the helium flow is terminated and the hydrogen flow rate again adjusted to a value within the range of 300 to 400 cc/min. and a gallium arsenide epitaxial film 32 (FIG. 4) is deposited over a time period within the range of 1 to 2 minutes, the thickness of film 32 ranging from 0.1 to 0.2 microns. As indicated above, the carrier concentration of film 32 is within the range of $5 \times 10^{15}$ atoms/cc to $2 \times 10^{17}$ atoms/cc. Studies of the resultant structure indicate a smooth uniform transition between the layers in the absence of the formation of any interfacial layers. The last step in the fabrication of an operative Schottky barrier device involves making ohmic contact 33 with epitaxial film 31 and Schottky contact 34 with film 32 by well-known prior art techniques (FIG. 5).

An example of the present invention is set forth below. This example is included merely for illustrative purposes and it will be appreciated by those skilled in the art that it is not intended to be restrictive in nature.

EXAMPLE

A semi-insulating gallium arsenide substrate member having a resistivity of approximately $10^7$ ohm-centimeters was selected. Initially, the substrate member was chemically polished to remove surface damage. Thereafter, it was placed in an apparatus of the type shown in FIG. 1 together with a source of gallium. The arsenic trichloride reservoir was maintained at a temperature of 25°C and the flow rate of hydrogen at 300 cc/min. Heating of the reaction chamber was next initiated and continued until the gallium attained a temperature of 750°C and the substrate a temperature of 800°C at which point epitaxial growth began. A vapor pressure of sulphur of $10^{-6}$ atmospheres was introduced into the system of produce the desired degree of doping. Growth of an epitaxial film of gallium arsenide, 7 microns in thickness, was then effected, the deposited layer having a carrier concentration of about $4 \times 10^{18}$ atoms/cc. Next, the doping level was reduced to $2 \times 10^{17}$ atoms/cc by reducin the quantity of dopant added to the system. Additionally, the composition of the carrier gas was altered to include both helium and hydrogen, the flow rate of helium began 400 cc/min. and that of hydrogen 20 cc/min., thereby resulting in etching of the epitaxial film. Etching was continued for 7 minutes, so resulting in the etching of 3½ micron of the deposited epitaxial layer. After etching the helium flow was turned off and the hydrogen flow increased to 300 cc/min. Epitaxial growth was continued for 2 minutes, thereby resulting in a 0.1–0.2 micron thick epitaxial film of gallium arsenide having a carrier concentration of about $2 \times 10^{17}$ atoms/cc. The substrate was then quickly withdrawn from the furnace, thereby terminating growth. The structure was completed by attaching an ohmic contact (Au, Sn) to the bottom epitaxial layer and a Schottky barrier contact (Ti, Pt and Au) to the upper layer by conventional techniques. The resultant device evidenced a reduction in parasitic capacitance by about one-half as compared with the conventional Schottky barrier millimeter waveguide.

What is claimed is:

1. Technique for the fabrication of a Schottky barrier diode which comprises the steps of (a) depositing a first epitaxial layer of gallium arsenide having a thickness within the range of 6 to 8 microns and a carrier concentration within the range of $3 \times 10^{18}$ to $5 \times 10^{18}$ atoms/cc upon a semi-insulating gallium arsenide substrate by vapor phase epitaxy utilizing the gallium-arsenic trichloride-hydrogen system, (b) etching said first epitaxial layer by adding helium to said system and establishing a carrier concentration within the range of $5 \times 10^{15}$ to $2 \times 10^{17}$ atoms/cc, etching being continued until said first epitaxial layer ranges in thickness from 3 to 5 microns, the flow rate of hydrogen ranging from 50 to 20 cc per minute and the flow rate of helium ranging from 350 to 450 cc per minute, (c) depositing a second epitaxial layer comprising gallium arsenide upon said first epitaxial layer, said second layer having a thickness within the range of 0.1 to 0.2 micron and a carrier concentration within the range of $5 \times 10^{15}$ atoms/cc to $2 \times 10^{17}$ atoms/cc, and (d) forming an ohmic contact upon said first layer and a Schottky contact upon said second layer.

2. Technique in accordance with claim 1 wherein said substrate has a maximum resistivity of $10^9$ ohm centimeters.

* * * * *